US012609656B2

(12) United States Patent (10) Patent No.: US 12,609,656 B2
Asami (45) Date of Patent: Apr. 21, 2026

(54) DOHERTY AMPLIFIER

(71) Applicant: Sumitomo Electric Industries, Ltd.,
Osaka (JP)

(72) Inventor: Hirotaka Asami, Osaka (JP)

(73) Assignee: Sumitomo Electric Industries, Ltd.,
Osaka (JP)

( * ) Notice: Subject to any disclaimer, the term of this
patent is extended or adjusted under 35
U.S.C. 154(b) by 421 days.

(21) Appl. No.: 18/204,059

(22) Filed: May 31, 2023

(65) Prior Publication Data

US 2023/0412127 A1     Dec. 21, 2023

(30) Foreign Application Priority Data

Jun. 15, 2022    (JP) ................................. 2022-096711

(51) Int. Cl.
H03F 1/02 (2006.01)
H03F 3/21 (2006.01)
(52) U.S. Cl.
CPC ........... H03F 1/0288 (2013.01); H03F 3/211
(2013.01); H03F 2200/387 (2013.01)
(58) Field of Classification Search
CPC ...... H03F 3/211; H03F 1/56; H03F 2200/294;
H03F 2200/451
USPC ......................................................... 330/295
See application file for complete search history.

(56) References Cited

U.S. PATENT DOCUMENTS

2009/0167438 A1 *  7/2009  Yang ..................... H03F 1/0288
330/295
2010/0060362 A1    3/2010  Kanaya et al.

| | | | |
|---|---|---|---|
| 2012/0025915 A1 * | 2/2012 | Ui ........................... | H03F 3/189 |
| | | | 330/124 R |
| 2018/0034419 A1 * | 2/2018 | Moronval ............... | H03F 3/604 |
| 2019/0296693 A1 * | 9/2019 | Ahmed ................... | H03F 3/195 |
| 2019/0319587 A1 * | 10/2019 | Srinidhi Embar ...... | H03F 1/565 |
| 2020/0204119 A1 * | 6/2020 | Roberts ................. | H03F 1/0288 |
| 2020/0244227 A1 * | 7/2020 | Nakatani ................. | H03F 1/56 |
| 2021/0013840 A1 * | 1/2021 | Kato ....................... | H03F 3/211 |
| 2021/0126593 A1 * | 4/2021 | Roberts .................. | H01L 23/66 |
| 2022/0021344 A1 | 1/2022 | Maeda et al. | |
| 2022/0021345 A1 * | 1/2022 | Komatsuzaki ........... | H03F 1/56 |

(Continued)

FOREIGN PATENT DOCUMENTS

| JP | H09172335 A | 6/1997 |
|---|---|---|
| JP | 2010068261 A | 3/2010 |

(Continued)

*Primary Examiner* — Hafizur Rahman

(74) *Attorney, Agent, or Firm* — Volpe Koenig

(57) ABSTRACT

A Doherty amplifier includes a distributor, a first amplifier, a second amplifier, a third node, an impedance conversion circuit having a first end connected to a first node and a second end connected to the third node, and rotating an impedance viewed from the first amplifier to the third node with respect to an impedance viewed from the first amplifier to the first node within a range of 360°±45° on a Smith chart in a second harmonic wave, and a harmonic tuning circuit having a third end connected to a line connecting the first amplifier and the third node at the first node, and making an absolute value of an impedance with respect to a reference potential at the third end in the second harmonic wave smaller than an absolute value of an impedance with respect to the reference potential at the third end in the fundamental wave.

9 Claims, 21 Drawing Sheets

(56) References Cited

U.S. PATENT DOCUMENTS

2022/0069776  A1 *    3/2022   Fukunaga ................. H03F 3/60
2022/0247360  A1 *    8/2022   Hampel ................... H04B 1/40
2023/0216452  A1 *    7/2023   Vaswani .............. H03F 1/0288
                                                        330/307

FOREIGN PATENT DOCUMENTS

JP           2010287930  A  *  12/2010
JP           2018-074320  A       5/2018
WO           2020202674  A1    10/2020

* cited by examiner

FIG. 5

DOHERTY AMPLIFIER

CROSS REFERENCE TO RELATED APPLICATIONS

This application claims priority based on Japanese Patent Application No. 2022-096711 filed on Jun. 15, 2022, and the entire contents of the Japanese patent applications are incorporated herein by reference.

FIELD

The present disclosure relates to a Doherty amplifier.

BACKGROUND

A Doherty amplifier is known as an amplifier for amplifying high frequency signals such as microwaves. In the Doherty amplifier, a main amplifier and a peak amplifier amplify input signals in parallel, and the amplified signals are combined at a combining node. It is known that a harmonic tuning circuit for processing a harmonic component is provided in any one of a line between the main amplifier and the combining node and another line between the peak amplifier and the combining node (for example, Patent Document 1: Japanese Patent Application Laid-Open No. 2018-74320).

SUMMARY

A Doherty amplifier according to the present disclosure includes: a distributor that distributes an input signal inputted to an input terminal into two signals; a first amplifier that amplifies one of the two signals and outputs a first amplified signal to a first node; a second amplifier that amplifies the other of the two signals and outputs a second amplified signal to a second node; a third node that combines the first amplified signal output from the first amplifier and the second amplified signal output from the second amplifier and outputs a combined signal to an output terminal; an impedance conversion circuit that has a first end connected to the first node and a second end connected to the third node, and rotates an impedance viewed from the first amplifier to the third node with respect to an impedance viewed from the first amplifier to the first node within a range of 360°±45° on a Smith chart in a second harmonic wave, the second harmonic wave having a twice as high as a frequency of a fundamental wave that is a signal having a center frequency of an operation band; and a harmonic tuning circuit that has a third end connected to a line connecting the first amplifier and the third node at the first node, and makes an absolute value of an impedance with respect to a reference potential at the third end in the second harmonic wave smaller than an absolute value of an impedance with respect to the reference potential at the third end in the fundamental wave.

A Doherty amplifier according to the present disclosure includes: a distributor that distributes an input signal inputted to an input terminal into two signals; a first amplifier that amplifies one of the two signals and outputs a first amplified signal to a first node; a second amplifier that amplifies the other of the two signals and outputs a second amplified signal to a second node; a third node that combines the first amplified signal output from the first amplifier and the second amplified signal output from the second amplifier and outputs a combined signal to an output terminal; an impedance conversion circuit that has a first end connected to the first node and a second end connected to the third node, and rotates an impedance viewed from the first amplifier to the third node with respect to an impedance viewed from the first amplifier to the first node within a range of 360°±45° on a Smith chart in a second harmonic wave, the second harmonic wave having a twice as high as a frequency of a fundamental wave that is a signal having a center frequency of an operation band; and a harmonic tuning circuit that has a third end connected to a fourth node positioned on any one of the third node, a first line connecting the first amplifier and the third node, a second line connecting the second amplifier and the third node, and a third line connecting the third node and the output terminal, and makes an absolute value of an impedance with respect to a reference potential at the third end in the second harmonic wave smaller than an absolute value of an impedance with respect to the reference potential at the third end in the fundamental wave; wherein an electrical length between the third node and the fourth node is ⅟₁₆ or less of the wavelength of the fundamental wave.

BRIEF DESCRIPTION OF DRAWINGS

FIG. 5 is a block diagram of a Doherty amplifier according to a third variation of the first embodiment.

DETAILED DESCRIPTION OF EMBODIMENTS

Figure 8:
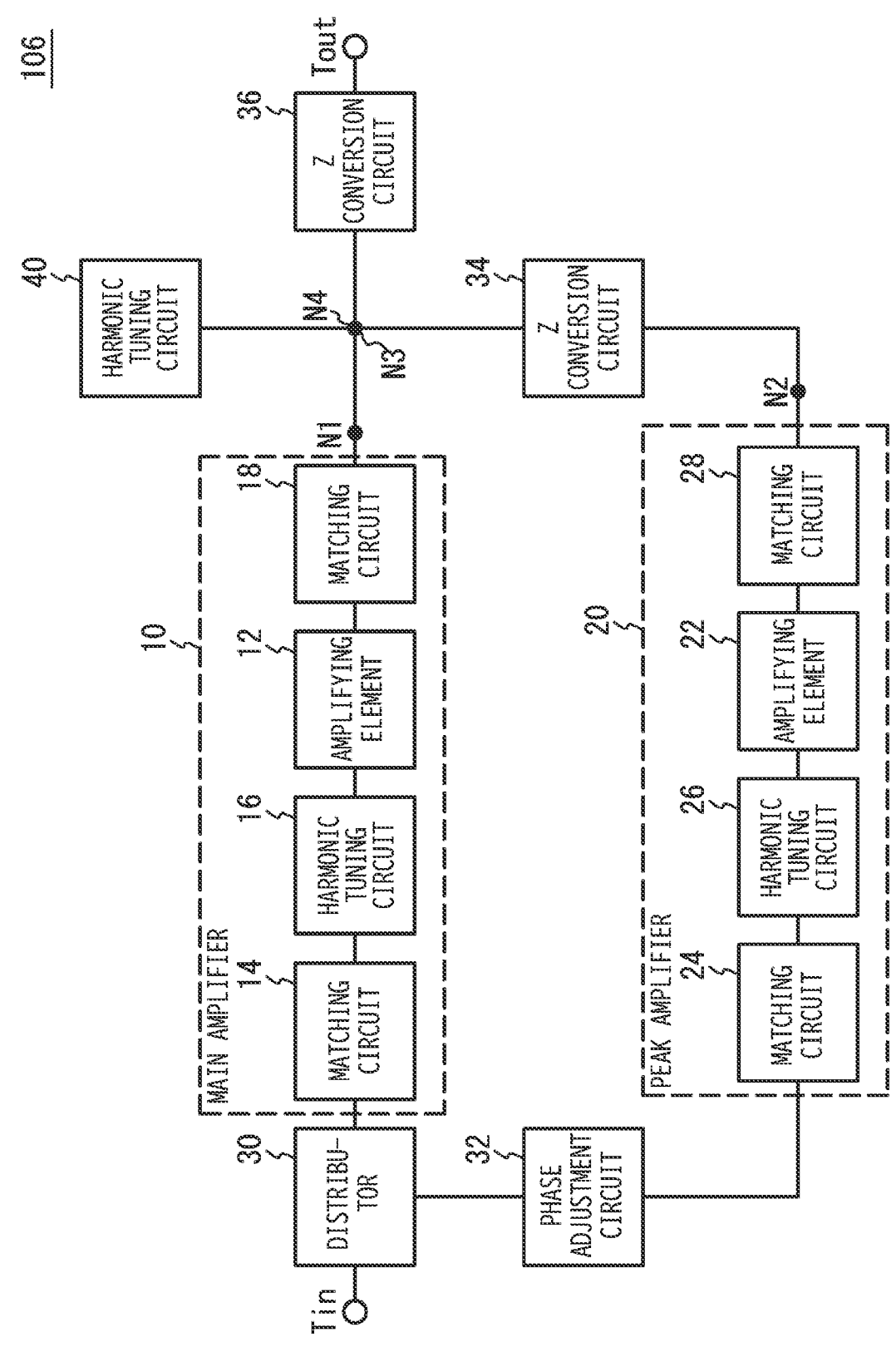
FIG. 8 is a block diagram of a Doherty amplifier according to a second variation of the second embodiment.
Figure 9:
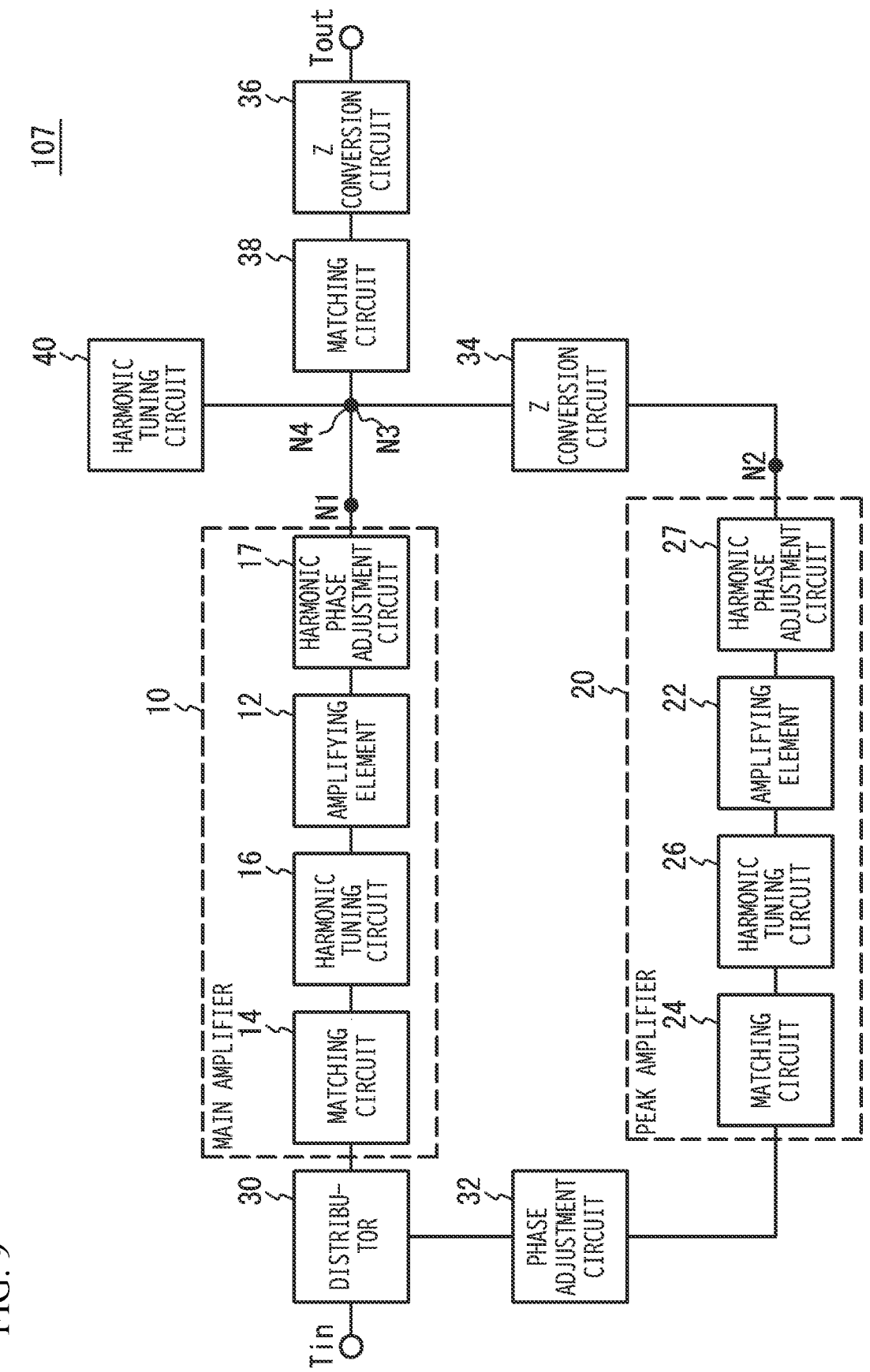
FIG. 9 is a block diagram of a Doherty amplifier according to a third variation of the second embodiment.

In FIGS. 8 and 9 of Patent Document 1, for example, a first terminal of one harmonic tuning circuit is connected to a node in a line between a main amplifier or a peak amplifier and a combining node. Patent Document 1 does not describe the length of the line between the node connecting the harmonic tuning circuit and the combining node. The Doherty amplifier can be miniaturized by using only one harmonic tuning circuit. However, if one harmonic tuning circuit does not appropriately process a harmonic wave output from the main amplifier and a harmonic wave output from the peak amplifier, the characteristic of the Doherty amplifier deteriorates.

The present disclosure has been made in view of the above problems, and an object of the present disclosure is to improve the characteristic of the Doherty amplifier.

DETAILS OF EMBODIMENTS OF THE PRESENT DISCLOSURE

First, the contents of the embodiments of this disclosure are listed and explained.

(1) A Doherty amplifier according to the present disclosure includes: a distributor that distributes an input signal inputted to an input terminal into two signals; a first amplifier that amplifies one of the two signals and outputs a first amplified signal to a first node; a second amplifier that amplifies the other of the two signals and outputs a second amplified signal to a second node; a third node that combines the first amplified signal output from the first amplifier and the second amplified signal output from the second amplifier and outputs a combined signal to an output terminal; an impedance conversion circuit that has a first end connected to the first node and a second end connected to the third node, and rotates an impedance viewed from the first amplifier to the third node with respect to an impedance viewed from the first amplifier to the first node within a range of $360°\pm45°$ on a Smith chart in a second harmonic wave, the second harmonic wave having a twice as high as a frequency of a fundamental wave that is a signal having a center frequency of an operation band; and a harmonic tuning circuit that has a third end connected to a line connecting the first amplifier and the third node at the first node, and makes an absolute value of an impedance with respect to a reference potential at the third end in the second harmonic wave smaller than an absolute value of an impedance with respect to the reference potential at the third end in the fundamental wave.

(2) A Doherty amplifier according to the present disclosure includes: a distributor that distributes an input signal inputted to an input terminal into two signals; a first amplifier that amplifies one of the two signals and outputs a first amplified signal to a first node; a second amplifier that amplifies the other of the two signals and outputs a second amplified signal to a second node; a third node that combines the first amplified signal output from the first amplifier and the second amplified signal output from the second amplifier and outputs a combined signal to an output terminal; an impedance conversion circuit that has a first end connected to the first node and a second end connected to the third node, and rotates an impedance viewed from the first amplifier to the third node with respect to an impedance viewed from the first amplifier to the first node within a range of $360°\pm45°$ on a Smith chart in a second harmonic wave, the second harmonic wave having a twice as high as a frequency of a fundamental wave that is a signal having a center frequency of an operation band; and a harmonic tuning circuit that has a third end connected to a fourth node positioned on any one of the third node, a first line connecting the first amplifier and the third node, a second line connecting the second amplifier and the third node, and a third line connecting the third node and the output terminal, and makes an absolute value of an impedance with respect to a reference potential at the third end in the second harmonic wave smaller than an absolute value of an impedance with respect to the reference potential at the third end in the fundamental wave; wherein an electrical length between the third node and the fourth node is $\frac{1}{16}$ or less of the wavelength of the fundamental wave.

(3) In the above (1) or (2), the harmonic tuning circuit may short-circuit between the third end and the reference potential in the second harmonic wave and may not short-circuit between the third end and the reference potential in the fundamental wave.

(4) In the above (1) or (2), the harmonic tuning circuit may open between the third end and the reference potential in the fundamental wave.

(5) In any one of (1) to (4) above, the harmonic tuning circuit may be a stub having an electric length of $\frac{3}{16}$ or more and $\frac{5}{16}$ or less of the wavelength of the fundamental wave, and a fourth end connected to the reference potential.

(6) In any one of (1) to (4) above, the harmonic tuning circuit may be a stub having an electrical length of $\frac{1}{16}$ or more and $\frac{3}{16}$ or less of the wavelength of the fundamental wave, and a fourth end being opened.

(7) In any one of (1) to (6) above, the impedance conversion circuit may rotate an impedance viewed from the first amplifier to the third node with respect to an impedance viewed from the first amplifier to the first node within a range of $180°\pm22.5°$ on a Smith chart in the fundamental wave.

(8) In any one of (1) to (6) above, the impedance conversion circuit may be a transmission line having an electric length of $\frac{3}{16}$ or more and $\frac{5}{16}$ or less of the fundamental wave.

(9) In any one of (1) to (8) above, the Doherty amplifier circuit may include no harmonic tuning circuit in which the third end is connected to a line connecting the second amplifier and the third node, and which makes the absolute value of the impedance with respect to the reference potential at the third end in the second harmonic wave smaller than the absolute value of the impedance with respect to the reference potential at the third end in the fundamental wave.

(10) In any one of (1) to (9) above, the first amplifier may be a main amplifier and the second amplifier may be a peak amplifier.

(11) In any one of (1) to (9) above, the first amplifier may be a peak amplifier and the second amplifier may be a main amplifier.

Specific examples of the Doherty amplifier in accordance with embodiments of the present disclosure are described below with reference to the drawings. The present disclosure is not limited to these examples, but is indicated by the claims, which are intended to include all modifications within the meaning and scope of the claims.

First Embodiment

Figure 1:
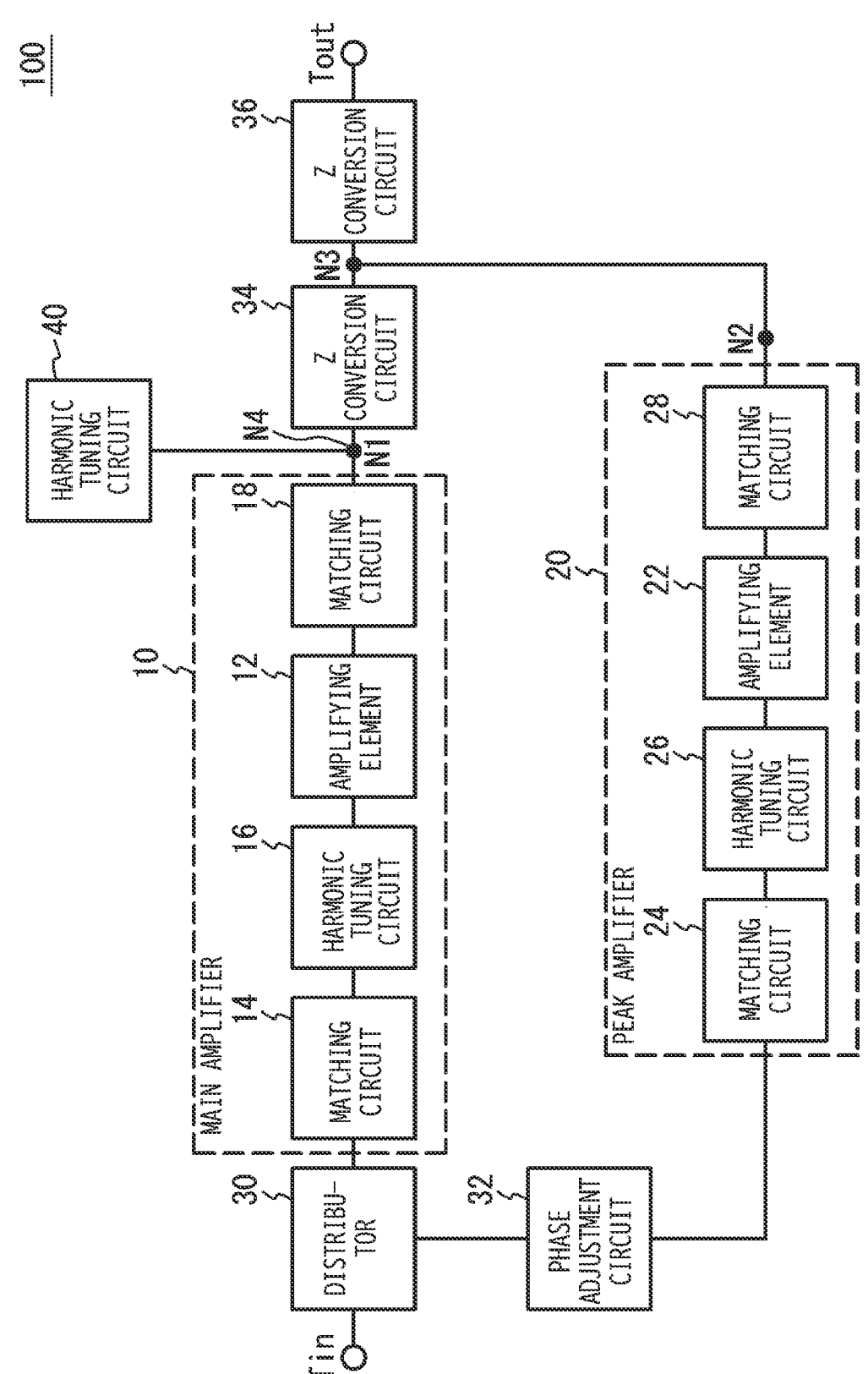
FIG. 1 is a block diagram of a Doherty amplifier according to the first embodiment.

A first embodiment and a first variation are examples of a forward Doherty amplifier having an impedance conversion circuit between a main amplifier and a combining node. FIG. 1 is a block diagram of the Doherty amplifier according to the first embodiment. As illustrated in FIG. 1, in a Doherty amplifier 100 of the first embodiment, a main amplifier 10 and a peak amplifier 20 are connected in parallel between an input terminal Tin and an output terminal Tout. A high frequency signal is input to the input terminal Tin as an input signal. A distributor 30 distributes an input signal inputted to the input terminal Tin into two signals. The distributor 30 is, for example, a Wilkinson distributor.

One of the distributed signals is input to the main amplifier 10. The main amplifier amplifies one of the distributed signals and outputs the amplified signal to a node N1. In the main amplifier 10, the input signal is input to an amplifying element 12 through a matching circuit 14 and a harmonic tuning circuit 16. The matching circuit 14 matches an impedance viewed from the distributor 30 to the matching circuit 14 with an impedance viewed from the matching circuit 14 to the amplifying element 12. The harmonic tuning circuit 16 is, for example, a filter for passing a fundamental wave included in the input signal and suppressing a harmonic signal. The harmonic tuning circuit 16 may not be provided. The amplifying element 12 amplifies the input signal and outputs the amplified signal to the node N1 via a matching circuit 18. The matching circuit 18 matches an impedance viewed from the amplifying element 12 to the matching circuit 18 with an impedance viewed from the matching circuit 18 to the node N1. A signal output from the main amplifier 10 to the node N1 is output to a node N3 via an impedance conversion circuit 34 (Z conversion circuit).

The other signal distributed by the distributor 30 is input to the peak amplifier 20 via a phase adjustment circuit 32. The phase adjustment circuit 32 adjusts a phase difference between the main amplifier 10 and the peak amplifier 20. The peak amplifier 20 amplifies the other signal and outputs the amplified signal to a node N2. In the peak amplifier 20, the input signal is input to an amplifying element 22 via a matching circuit 24 and a harmonic tuning circuit 26. The matching circuit 24 matches an impedance viewed from the distributor 30 to the matching circuit 24 with an impedance viewed from the matching circuit 24 to the amplifying element 22. The harmonic tuning circuit 26 is, for example, a filter for passing a fundamental wave included in an input signal and suppressing a harmonic signal. The harmonic tuning circuit 26 may not be provided. The amplifying element 22 amplifies the input signal and outputs the amplified signal to the node N2 via a matching circuit 28. The matching circuit 28 matches an impedance viewed from the amplifying element 22 to the matching circuit 28 with an impedance viewed from the matching circuit 28 to the node N2. The signal output from the peak amplifier to the node N2 is output to the node N3.

The node N3 (third node), which is the combining node, combines the signal output from the main amplifier 10 and the signal output from the peak amplifier 20, and outputs the combined signal to the output terminal Tout. An impedance conversion circuit 36 (Z conversion circuit) converts an impedance viewed from the node N3 to the impedance conversion circuit 36 to an impedance viewed from the impedance conversion circuit 36 to the output terminal Tout.

The amplifying elements 12 and 22 are, for example, FETs (Field Effect Transistors), and their sources are grounded, high frequency signals are input to gates of the FETs, and signals are output from drains of the FETs. Each of the FETs is, for example, a GaNFET or an LDMOS (Laterally Diffused Metal Oxide Semiconductor). Each of the amplifying elements 12 and 22 may be provided with a multi-stage FET. Bias circuits for supplying bias voltages to the amplifying elements 12 and 22 are omitted.

The amplifying element 12 performs class AB or class B operation, and the amplifying element 22 performs class C operation. When the input power is small, the amplifying element 12 mainly amplifies the input signal. When the input power becomes large, the amplifying element 22 amplifies the peak of the input signal in addition to the amplification of the input signal by the amplifying element 12. Thus, the amplifying elements 12 and 22 amplify the input signals. When the input power is small and the amplifying element 22 is off, the impedance viewed from the main amplifier 10 to the node N3 is twice (for example, 100Ω) of a load R of the output terminal Tout. When the input power becomes large and the amplifying element 22 operates, the impedance from the main amplifier 10 to the node N3 and the impedance from the peak amplifier 20 to the node N3 are the load R (for example, 50Ω) of the output terminal Tout. The matching circuit 18 is adjusted so that the amplifying element 12 operates optimally at a saturated output power (for example, the efficiency is maximized) in the load 2R when the amplifying element 22 is off, and so that the amplifying element 12 operates optimally at the saturated output power (for example, the efficiency is maximized) in the load R when the amplifying element 22 operates. The matching circuit 28 is adjusted so that the impedance viewed from the node N3 to the amplifying element 22 is open when the amplifying element 22 is off, while the matching circuit 28 is adjusted so that the amplifying element 22 operates optimally at the saturated output power in the load R when the amplifying element 22 operates.

The fundamental wave is a signal at the center frequency of the operating band of the Doherty amplifier 100 (i.e., the frequency band at which the Doherty amplifier can obtain a desired amplification characteristic). A second harmonic wave is a signal having twice the frequency of the fundamental wave. The amplifying elements 12 and 22 amplify the fundamental wave but generate the second harmonic waves. When the second harmonic wave output from the output terminal Tout is large, energy is output as the second harmonic wave, so that efficiency in the fundamental wave is reduced. A harmonic tuning circuit 40 is provided in order to improve the characteristics of the Doherty amplifier 100 by processing the harmonic wave so that the second harmonic wave is not outputted from the outputting terminal Tout.

A first end of the harmonic tuning circuit 40 is connected to the node N1. When a node to which the harmonic tuning circuit 40 is connected to the signal line is referred to as a node N4, the nodes N1 and N4 coincide with each other. The harmonic tuning circuit 40 short-circuits the nodes N1 and N4 with respect to a reference potential such as ground for the second harmonic wave, and does not short-circuits the nodes N1 and N4 with respect to the reference potential for the fundamental wave and makes the nodes N1 and N4 in a state close to open, for example. When the nodes N1 and N4 and the reference potential are short-circuited, an absolute value of an impedance between the nodes N1 and N4 and the reference potential is substantially 0. When nodes N1 and N4 and the reference potential are opened, the absolute value of the impedance between nodes N1 and N4 and the reference potential is almost infinite.

Figure 2:
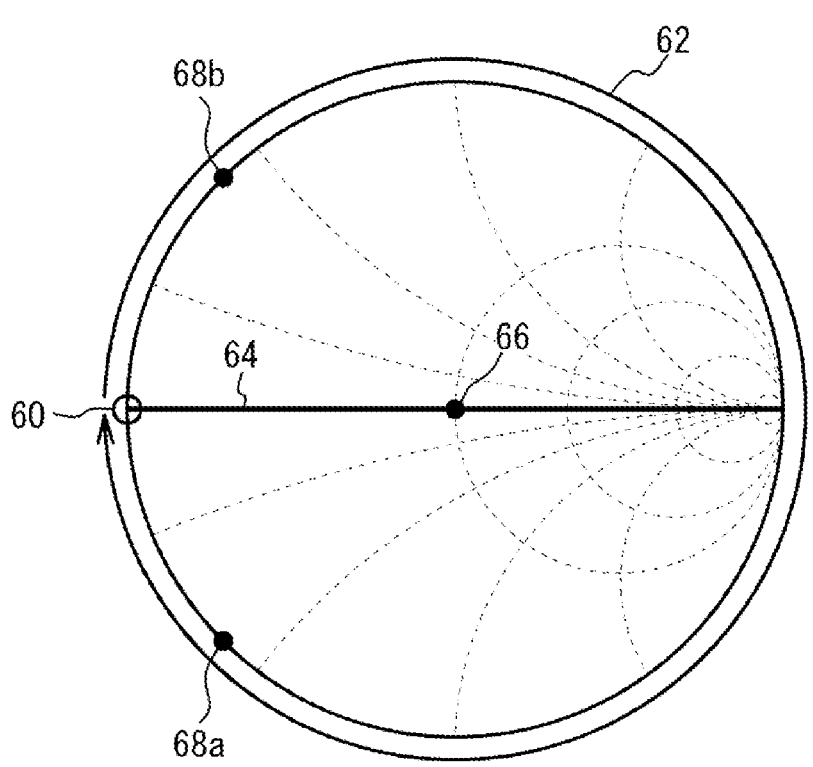
FIG. 2 is a Smith chart of the impedance at nodes N1 and N3 in the first embodiment.

FIG. 2 is a Smith chart of the impedance at the nodes N1 and N3 in the first embodiment. The impedance is an impedance viewed from the main amplifier 10 to the node N1 or N3. Due to the harmonic tuning circuit 40, the impedance of the second harmonic wave at the node N1 is short-circuited, and is at a short-circuit position 60 in FIG. 2. Thus, the second harmonic wave output from the main amplifier 10 is mostly reflected at the node N1.

The impedance conversion circuit 34 rotates the impedance viewed from the matching circuit 18 to the node N1 by 360° in the clockwise direction around a reference impedance 66 as indicated by an arrow 62 on the Smith chart of FIG. 2 to convert it into the impedance viewed from the impedance conversion circuit 34 to the node N3. As a result, the impedance viewed from the matching circuit 18 to the node N3 and the impedance viewed from the impedance conversion circuit 34 to the node N1 are at substantially the same position on the Smith chart. Therefore, the impedance of the second harmonic wave at the node N3 is short-circuited, and is at the short-circuit position 60 in FIG. 2. Thus, the second harmonic wave output from the peak amplifier 20 is mostly reflected at the node N3.

On the other hand, in the fundamental wave, the load impedance viewed from the amplifying element 12 to the matching circuit 18 is set so that the amplifying element 12 operates optimally as described above. The matching circuit 18 converts the load impedance having an imaginary component viewed from the amplifying element 12 to the matching circuit 18 into the impedance seen from the matching circuit 18 to the node N1. The impedance seen from the matching circuit 18 to the node N1 is located on a substantially real axis 64 of FIG. 2. The harmonic tuning circuit 40 makes the node N1 substantially open with respect to the reference potential in the fundamental wave. Therefore, the harmonic tuning circuit 40 hardly affects the impedance viewed from the matching circuit 18 to the node N1. Therefore, the fundamental wave output from the main amplifier 10 is hardly reflected at the node N1. The impedance conversion circuit 34 rotates the impedance viewed from the matching circuit 18 to the node N1 by 180° clockwise around the reference impedance 66 in FIG. 2 to convert it into the impedance viewed from the impedance conversion circuit 34 to the node N3. Thus, the impedance conversion circuit 34 functions as an impedance conversion circuit for converting the impedance on the substantially real axis 64 in FIG. 2 at the node N1 into the impedance on the substantially real axis 64 at the node N3 with respect to the fundamental wave. The fundamental wave output from the peak amplifier 20 is hardly reflected at the node N3.

As described above, a reflection coefficient at the node N1 of the second harmonic wave transmitted from the main amplifier 10 to the node N1 is larger than a reflection coefficient of the fundamental wave transmitted from the main amplifier 10 to the node N1, and a reflection coefficient at the node N3 of the second harmonic wave transmitted from the peak amplifier 20 to the node N3 is larger than a reflection coefficient of the fundamental wave transmitted from the peak amplifier 20 to the node N3.

The fundamental waves amplified by the main amplifier 10 and the peak amplifier 20 are combined at the node N3, and the combined fundamental wave is output from the output terminal Tout. On the other hand, the second harmonic waves generated in the main amplifier and the peak amplifier 20 are reflected at the nodes N1 and N3, respectively, and are hardly output from the output terminal Tout. Therefore, the high frequency characteristics of the Doherty amplifier 100 can be improved. It is to be noted that the phases of the fundamental waves amplified by the main amplifier 10 and the peak amplifier 20 at the node N3 are adjusted by the phase adjustment circuit 32 or the like so that the phases of the fundamental waves at the node N3 are the same as each other.

As described above, since the main amplifier 10 and the peak amplifier 20 do not need to be provided with the harmonic tuning circuits, respectively, the Doherty amplifier can be reduced in size. Even when one harmonic tuning circuit 40 is used, the harmonic wave can be processed to the same extent as when the main amplifier 10 and the peak amplifier 20 are respectively provided with the harmonic tuning circuits. Therefore, it is possible to improve the harmonic characteristics of the Doherty amplifier 100.

First Variation of First Embodiment

Figure 3:
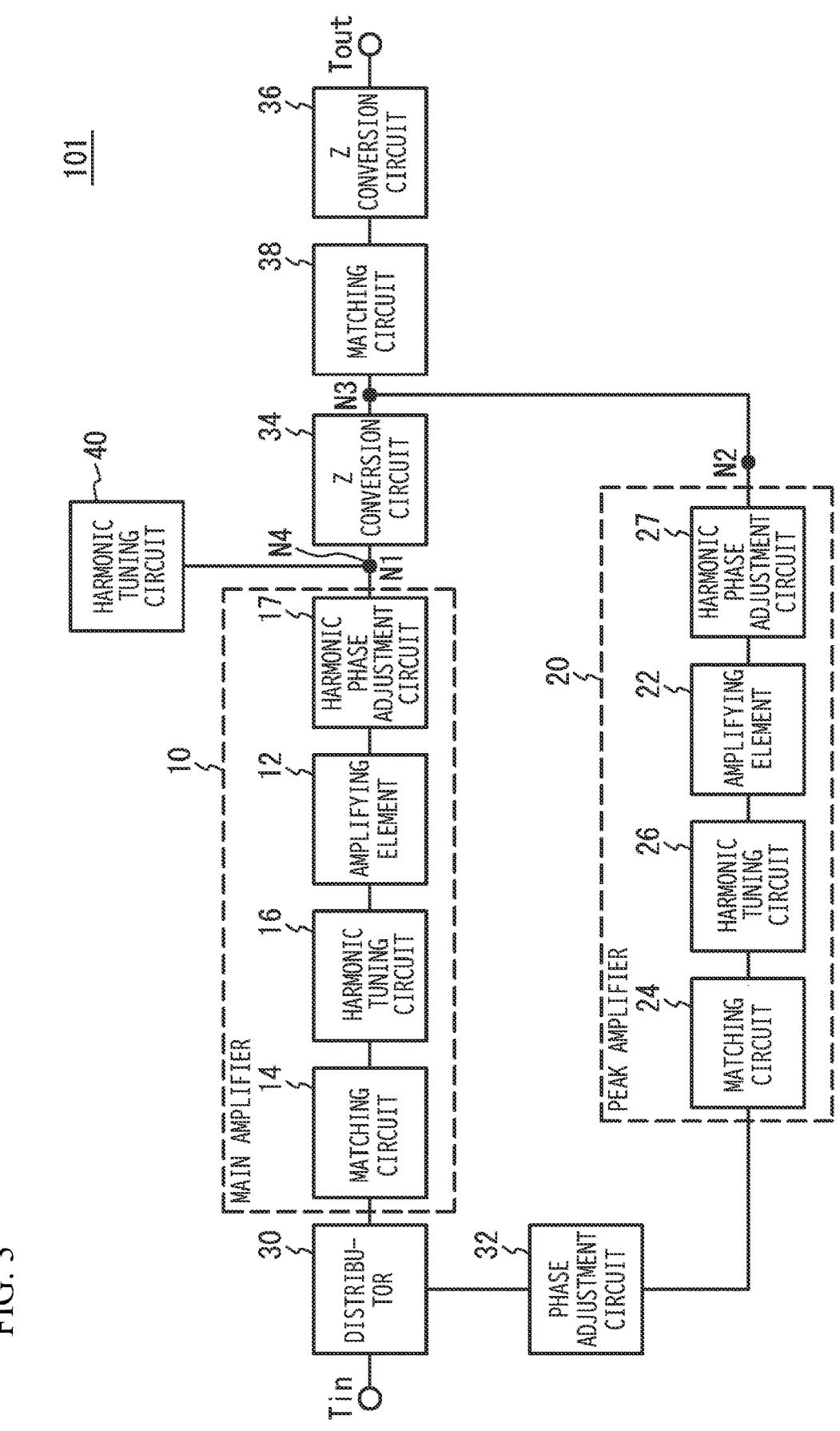
FIG. 3 is a block diagram of a Doherty amplifier according to a first variation of the first embodiment.

FIG. 3 is a block diagram of a Doherty amplifier according to a first variation of the first embodiment. As illustrated in FIG. 3, in a Doherty amplifier 101 of the first variation of the first embodiment, the matching circuit 18 is not provided in the main amplifier 10, but a harmonic phase adjustment circuit 17 is provided instead of the matching circuit 18. The matching circuit 28 is not provided in the peak amplifier 20, and a harmonic phase adjustment circuit 27 is provided instead of the matching circuit 28. A matching circuit 38 is provided between the node N3 and the impedance conversion circuit 36. Other configurations are the same as those of the first embodiment, and description thereof is omitted.

The matching circuit 38 may be provided between the node N3 and the output terminal Tout without providing the matching circuit 18 in the main amplifier 10 and the matching circuit 28 in the peak amplifier 20 as in the first variation of the first embodiment. When there is only one matching circuit 38 on the output side, the load impedances of both of the amplifying elements 12 and 22 may not be optimized. In such a case, the load impedance of the amplifying element 12 is preferentially optimized. In the first embodiment, the matching circuits 18 and 28 may adjust the phases of the second harmonic waves in anticipation of the second harmonic waves being reflected at the nodes N1 and N3. In such a case, in the first variation of the first embodiment, the harmonic phase adjustment circuits 17 and 27 for adjusting the phases of the second harmonic waves are provided. The harmonic phase adjustment circuits 17 and 27 may not be provided.

Second Variation of First Embodiment

Figure 4:
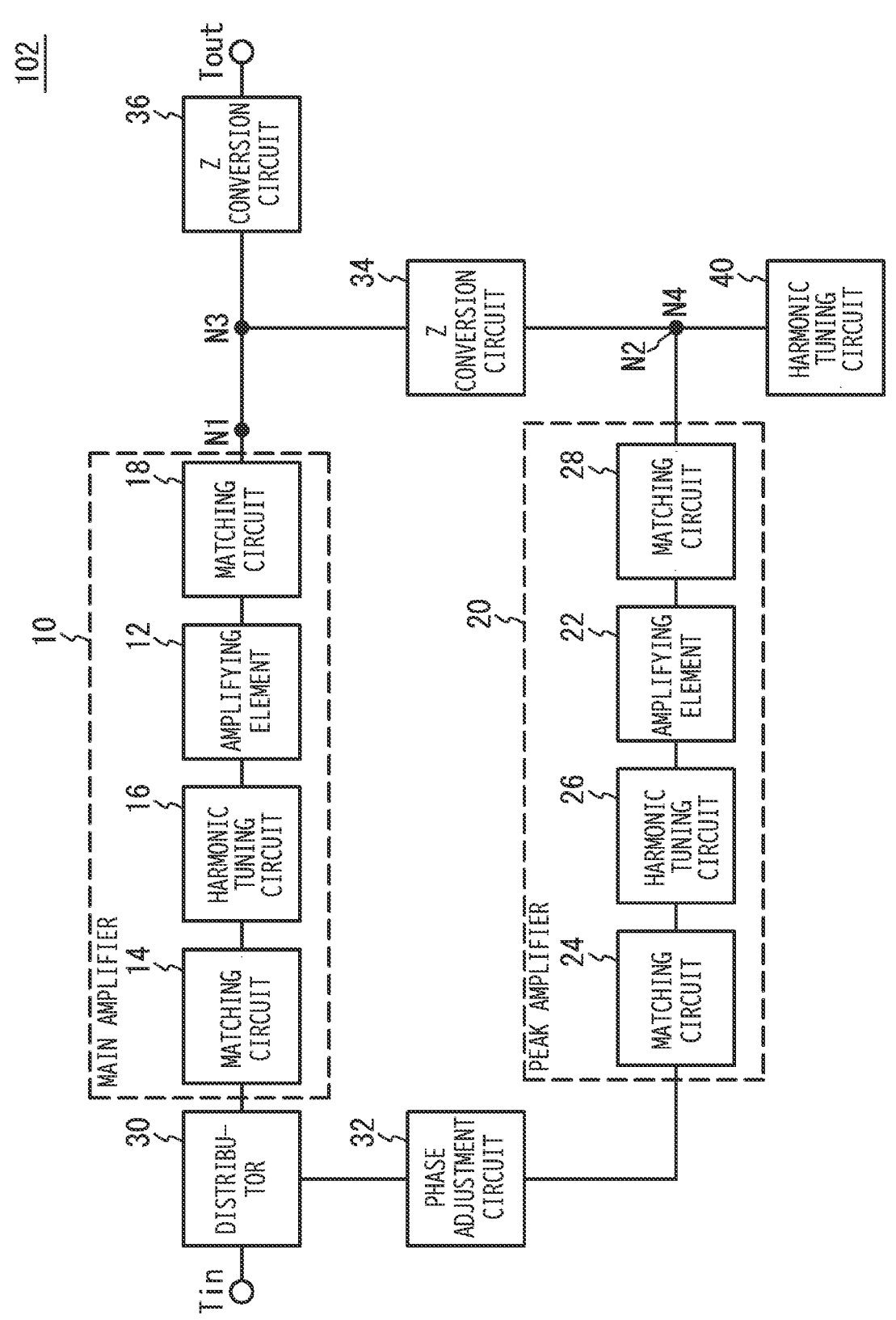
FIG. 4 is a block diagram of a Doherty amplifier according to a second variation of the first embodiment.

Second and third variations of the first embodiment are examples of an inverse Doherty amplifier having the impedance conversion circuit between the peak amplifier and the combining node. FIG. 4 is a block diagram of the Doherty amplifier according to the second variation of the first embodiment. As illustrated in FIG. 4, in a Doherty amplifier 102 of the second variation of the first embodiment, the impedance conversion circuit 34 is provided between the nodes N2 and N3. The harmonic tuning circuit 40 is connected to a line between the peak amplifier 20 and the node N3 at the node N2. Other configurations are the same as those of the first embodiment, and description thereof is omitted.

In the second variation of the first embodiment, the first end of the harmonic tuning circuit 40 is connected to the node N2. The node N4 to which the harmonic tuning circuit 40 is connected to the signal line and the node N2 substantially coincide with each other. The harmonic tuning circuit 40 substantially short-circuits the nodes N2 and N4 with respect to the reference potential in the second harmonic wave, and does not short-circuit the nodes N2 and N4 with respect to the reference potential in the fundamental wave, so that the nodes N2 and N4 are in a state close to open, for example. Thus, the fundamental wave of the signal output from the peak amplifier 20 is hardly reflected at the node N2 and passes through the node N2. The second harmonic wave is mostly reflected at the node N2 and does not pass through the node N2. The node N3 and the ground are substantially short-circuited in the second harmonic wave by the impedance conversion circuit 34. On the other hand, the fundamental wave does not short-circuit between the node N3 and the ground. Therefore, the fundamental wave of the signal output from the main amplifier 10 is hardly reflected at the node N3 and passes through the node N3. The second harmonic wave is mostly reflected at the node N3. In this way, the fundamental waves amplified by the main amplifier 10 and the peak amplifier 20 are combined at the node N3 and output from the output terminal Tout. The second harmonic waves generated in the main amplifier 10 and the peak amplifier 20 are reflected at the nodes N3 and N2, respectively, and are hardly output from the output terminal Tout.

Third Variation of First Embodiment

Figure 5:
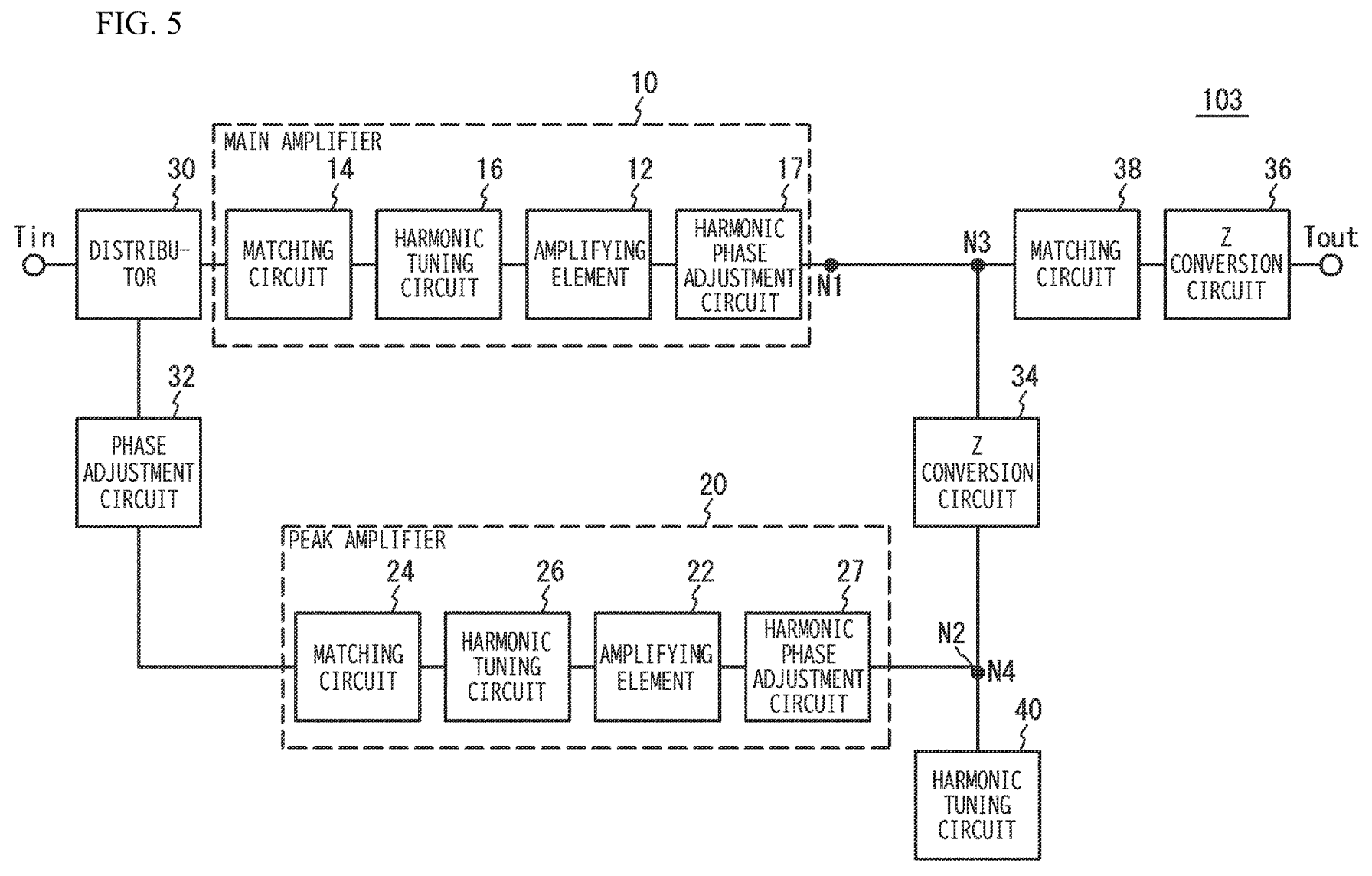

FIG. 5 is a block diagram of a Doherty amplifier according to a third variation of the first embodiment. As illustrated in FIG. 5, in a Doherty amplifier 103 of the third variation of the first embodiment, the matching circuit 18 is not provided in the main amplifier 10, but the harmonic phase adjustment circuit 17 is provided instead of the matching circuit 18. The matching circuit 28 is not provided in the peak amplifier 20, and the harmonic phase adjustment circuit 27 is provided instead of the matching circuit 28. The matching circuit 38 is provided between the node N3 and the impedance conversion circuit 36. Other configurations are the same as those of the second modification of the first embodiment, and description thereof will be omitted.

Second Embodiment

Figure 6:
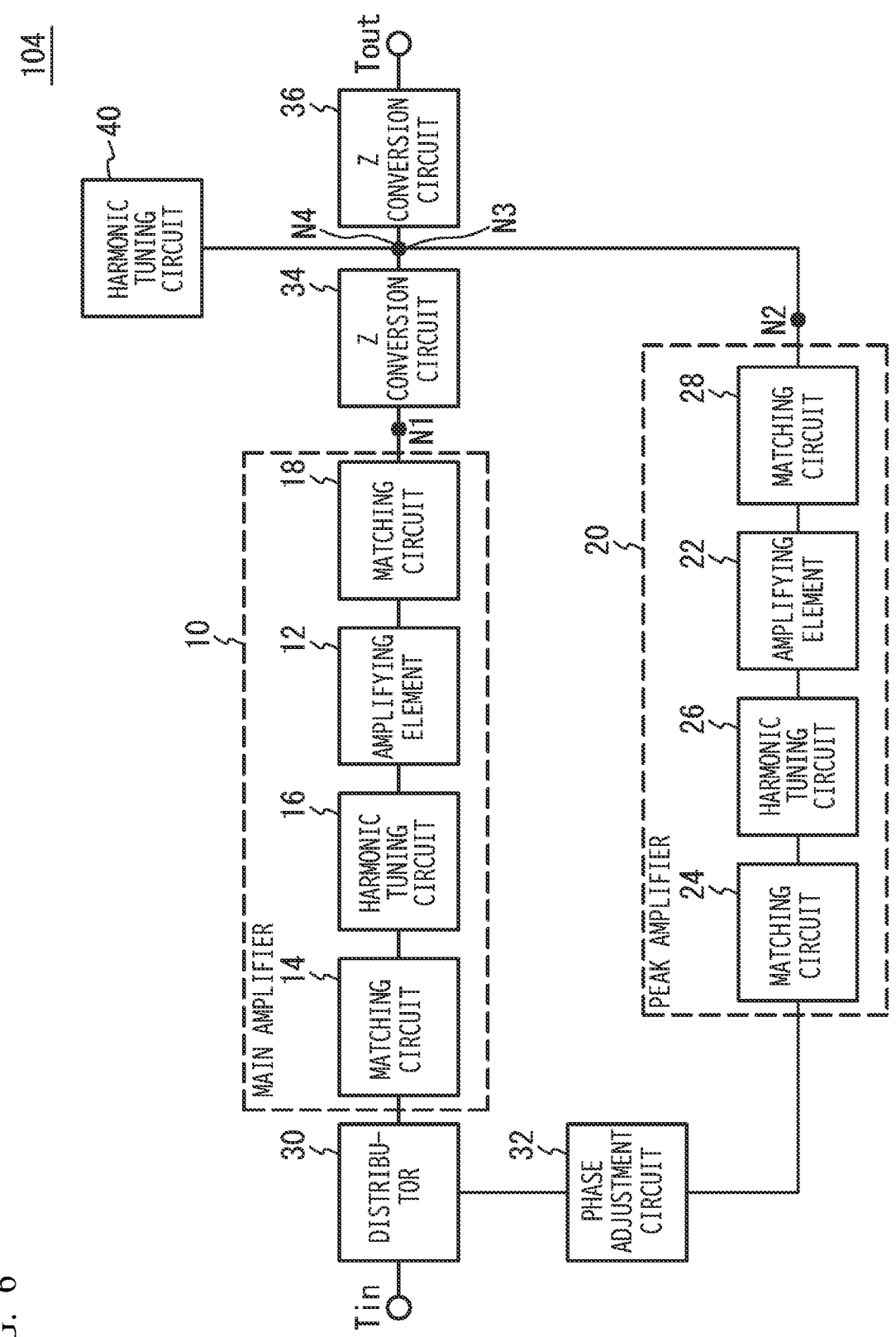
FIG. 6 is a block diagram of a Doherty amplifier according to a second embodiment.

The second embodiment and the first modification thereof are examples of the forward Doherty amplifiers. FIG. 6 is a block diagram of a Doherty amplifier according to a second embodiment. As illustrated in FIG. 6, in a Doherty amplifier 104 of the second embodiment, the first end of the harmonic tuning circuit 40 is connected to the node N3. In other words, the node N4 at which the harmonic tuning circuit 40 is connected to the signal line and the node N3 which is the combining node substantially coincide with each other. Other configurations are the same as those of the first embodiment, and description thereof is omitted.

The harmonic tuning circuit 40 short-circuits the nodes N3 and N4 with respect to the reference potential in the second harmonic wave, and does not short-circuits the nodes N3 and N4 with respect to the reference potential in the fundamental wave, so that the nodes N3 and N4 are in a state close to open, for example. Thus, the fundamental wave of the signal output from the peak amplifier 20 is hardly reflected at the node N3 and passes through the node N3. The second harmonic wave is mostly reflected at the node N3. The node N1 and the reference potential are short-circuited by the impedance conversion circuit 34 in the second harmonic wave. Therefore, the fundamental wave of the signal output from the main amplifier 10 passes through the node N1, and the second harmonic wave of the signal output from the main amplifier 10 is mostly reflected at the node N1. As described above, the second harmonic waves generated in the main amplifier 10 and the peak amplifier 20 are reflected at the nodes N1 and N3, respectively, and are not output from the output terminal Tout.

In this way, the fundamental waves amplified by the main amplifier 10 and the peak amplifier 20 are combined at the node N3, and the combined fundamental wave is output from the output terminal Tout. On the other hand, the second harmonic waves generated in the main amplifier 10 and the peak amplifier 20 are reflected at the nodes N1 and N3, respectively, and are hardly output from the output terminal Tout.

First Variation of Second Embodiment

Figure 7:
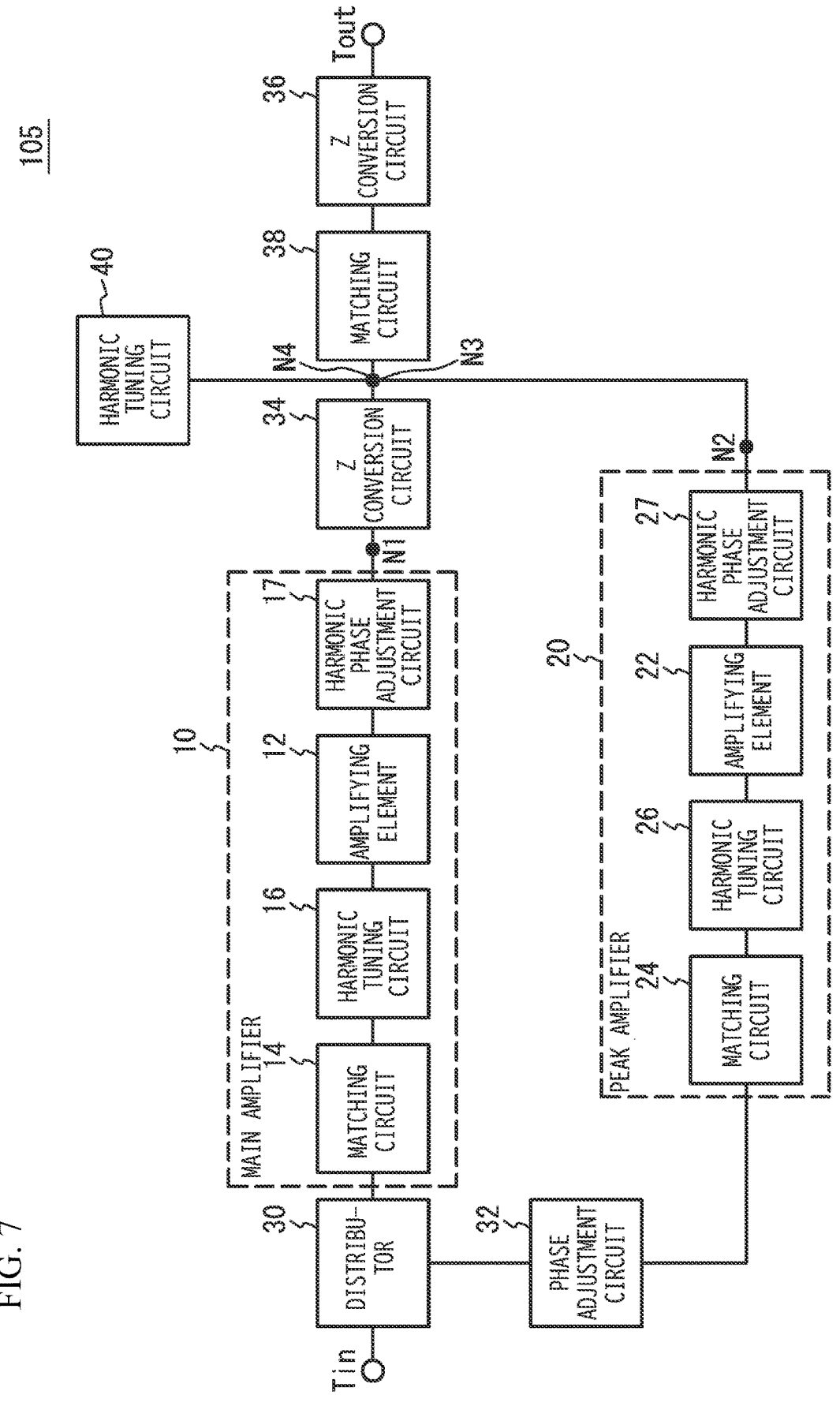
FIG. 7 is a block diagram of a Doherty amplifier according to a first variation of the second embodiment.

FIG. 7 is a block diagram of a Doherty amplifier according to a first variation of the second embodiment. As illustrated in FIG. 7, in a Doherty amplifier 105 of the first variation of the second embodiment, the matching circuit 18 is not provided in the main amplifier 10, but the harmonic phase adjustment circuit 17 is provided instead of the matching circuit 18. The matching circuit 28 is not provided in the peak amplifier 20, and the harmonic phase adjustment circuit 27 is provided instead of the matching circuit 28. The matching circuit 38 is provided between the node N3 and the impedance conversion circuit 36. Other configurations are the same as those of the second embodiment, and description thereof is omitted.

Second Variation of Second Embodiment

Second and third variations of the second embodiment are examples of an inverse Doherty amplifiers. FIG. 8 is a block diagram of a Doherty amplifier according to a second variation of the second embodiment. As illustrated in FIG. 8, in a Doherty amplifier 106 of the second variation of the second embodiment, the impedance conversion circuit 34 is provided between the nodes N2 and N3. Other configurations are the same as those of the second embodiment, and description thereof is omitted.

In the second variation of the second embodiment, the fundamental wave of the signal output from the main amplifier 10 is hardly reflected at the node N3 and passes through the node N3, by the harmonic tuning circuit 40. The second harmonic wave is mostly reflected at the node N3 and does not pass through the node N3. By the impedance conversion circuit 34, the node N2 and the ground are not short-circuited in the fundamental wave but are short-circuited in the second harmonic wave. Therefore, the fundamental wave of the signal output from the peak amplifier 20 is hardly reflected at the node N2 and passes through the node N3. The second harmonic wave is mostly reflected at the node N2. In this way, the fundamental waves amplified by the main amplifier 10 and the peak amplifier 20 are combined at the node N3 and output from the output terminal Tout. The second harmonic waves generated by the main amplifier 10 and the peak amplifier 20 are reflected at the nodes N3 and N2 respectively and are hardly output from the output terminal Tout.

Third Variation of Second Embodiment

FIG. 9 is a block diagram of a Doherty amplifier according to a third variation of the second embodiment. As illustrated in FIG. 9, in a Doherty amplifier 107 of the third variation of the second embodiment, the matching circuit 18 is not provided in the main amplifier 10, but the harmonic phase adjustment circuit 17 is provided instead of the matching circuit 18. The matching circuit 28 is not provided in the peak amplifier 20, and the harmonic phase adjustment circuit 27 is provided instead of the matching circuit 28. The matching circuit 38 is provided between the node N3 and the impedance conversion circuit 36. Other configurations are the same as those of the second variation of the second embodiment, and description thereof will be omitted.

[Example of Harmonic Tuning Circuit 40]

Figure 10:
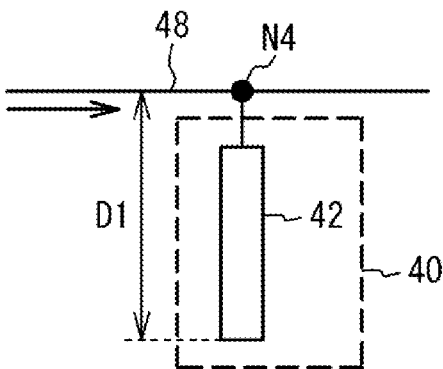
FIG. 10 is a circuit diagram illustrating an example of a harmonic tuning circuit in the first and the second embodiments and the variations thereof.

FIGS. 10 to 13 are circuit diagrams illustrating examples of the harmonic tuning circuit in the first and the second embodiments and the variations thereof. As illustrated in FIG. 10, the first end of the harmonic tuning circuit 40 is connected to a transmission line 48 at the node N4. A high frequency signal including the fundamental wave and the second harmonic wave flows through the transmission line 48 from left to right as indicated by an arrow. The harmonic tuning circuit 40 is an open stub. A first end of a stub 42 is connected to the transmission line 48 at the node N4. A second end of the stub 42 is open. When an electrical length D1 from the node N4 of the stub 42 is ⅛ of a wavelength k of the fundamental wave, the node N4 is short-circuited with respect to the reference potential in the second harmonic wave, and the node N4 is not short-circuited with respect to the reference potential in the fundamental wave. Thus, the second harmonic wave is reflected at the node N4. From the viewpoint of substantially short-circuiting the node N4 with respect to the reference potential, the electrical length D1 of the stub 42 is preferably $1\lambda/16$ or more and $3\lambda/16$ or less, more preferably $3\lambda/32$ or more and $5\lambda/32$ or less, and even more preferably $7\lambda/64$ or more and $9\lambda/64$ or less.

Figure 11:
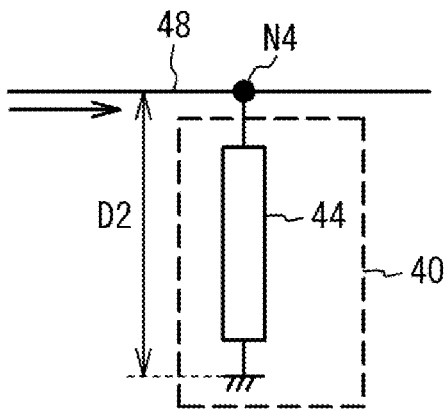
FIG. 11 is a circuit diagram illustrating an example of a harmonic tuning circuit in the first and the second embodiments and the variations thereof.

As illustrated in FIG. 11, the harmonic tuning circuit 40 is a short stub. A first end of a stub 44 is connected to the transmission line 48 at the node N4, and a second end of the stub 44 is connected to a reference potential such as ground. When an electrical length D2 from the node N4 of the stub 44 to the reference potential is ¼ of the wavelength λ, of the fundamental wave, the node N4 is short-circuited with respect to the reference potential in the second harmonic wave, and the node N4 is opened with respect to the reference potential in the fundamental wave. Thus, the second harmonic wave is reflected at the node N4. From the viewpoint of substantially short-circuiting the node N4 with respect to the reference potential, the electrical length D2 of the stub 44 is preferably $3\lambda/16$ or more and $5\lambda/16$ or less, more preferably $7\lambda/32$ or more and $9\kappa/32$ or less, and even more preferably $15\lambda/64$ or more and $17\lambda/64$ or less. In the short stub, the node N4 can be opened with respect to the reference potential in the fundamental wave, so that the reflection of the fundamental wave at the node N4 can be made smaller.

Figure 12:
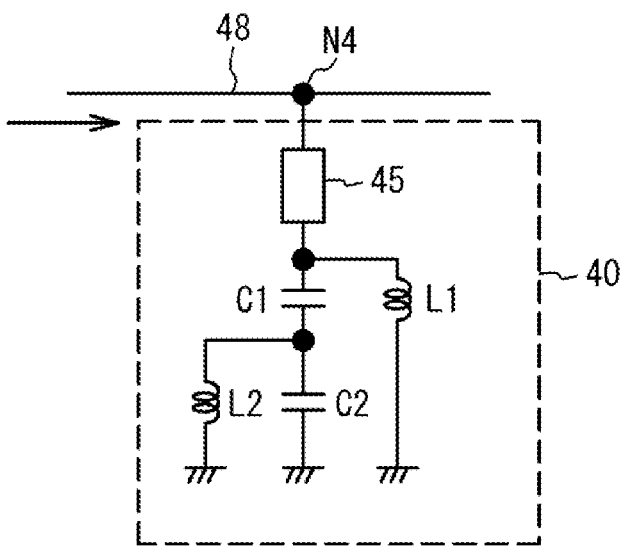
FIG. 12 is a circuit diagram illustrating an example of a harmonic tuning circuit in the first and the second embodiments and the variations thereof.

As illustrated in FIG. 12, the harmonic tuning circuit 40 is a CRLH (Composite Right/Left Handed) line. A transmission line 45 and capacitors C1 and C2 are connected in series between the node N4 and the reference potential. An inductor L1 is connected between the reference potential and a node between the transmission line 45 and the capacitor C1. An inductor L2 is connected between the reference potential and the node between the capacitors C1 and C2. By setting the capacitances of the capacitors C1 and C2 and the inductances of the inductors L1 and L2 to appropriate values, the node N4 is short-circuited with respect to the reference potential in the second harmonic wave, and the node N4 is not short-circuited with respect to the reference potential in the fundamental wave.

Figure 13:
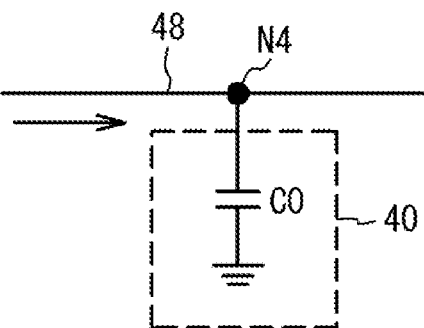
FIG. 13 is a circuit diagram illustrating an example of a harmonic tuning circuit in the first and the second embodiments and the variations thereof.

As illustrated in FIG. 13, the harmonic tuning circuit 40 is a shunt capacitor. A capacitor C0 is shunt-connected to the node N4. By shunt-connecting the capacitor C0, an absolute value of an impedance between the node N4 and the reference potential in the second harmonic wave can be made smaller than an absolute value of an impedance between the node N4 and the reference potential in the fundamental wave. Thus, the reflection coefficient of the second harmonic wave at the node N4 becomes larger than the reflection coefficient of the fundamental wave. By appropriately selecting the capacitance of capacitor C0, a difference between the reflection coefficient of the second harmonic wave and the reflection coefficient of the fundamental wave at the node N4 can be made larger.

As illustrated in FIGS. 10 to 13, the harmonic tuning circuit 40 may make the absolute value of the impedance with respect to the reference potential at the node N4 in the second harmonic wave smaller than the absolute value of the impedance with respect to the reference potential at the node N4 in the fundamental wave. The absolute value of the impedance with respect to the reference potential at the node N4 in the second harmonic wave is preferably ⅕ or less, more preferably ¹⁄₁₀ or less, and still more preferably ¹⁄₂₀ or less of the absolute value of the impedance with respect to the reference potential at the node N4 in the fundamental wave.

It is preferable that the harmonic tuning circuit 40 short-circuits between the node N4 and the reference potential in the second harmonic wave and does not short-circuit between the node N4 and the reference potential in the fundamental wave. Thus, the reflection coefficient of the second harmonic wave at the node N4 becomes almost 1, and the harmonic tuning circuit 40 reflects the second harmonic wave at the node N4. The fundamental wave almost passes through node N4. The short-circuit between the node N4 and the reference potential in the frequency of the second harmonic wave means that the absolute value of the impedance between the node N4 and the reference potential is ⅕ times or less of a reference impedance. More preferably, the absolute value of the impedance between the node N4 and the reference potential is ¹⁄₁₀ times or less of the reference impedance.

As in the short stub of FIG. 11, the harmonic tuning circuit 40 opens between the node N4 and the reference potential in the frequency of the fundamental wave. Thus, the reflection coefficient of the fundamental wave at the node N4 becomes almost 0, and the harmonic tuning circuit 40 does not reflect the fundamental wave at the node N4. Here, the opening between the node N4 and the reference potential in the frequency of the fundamental wave means that the absolute value of the impedance between the node N4 and the reference potential is five times or more of the reference impedance. More preferably, the absolute value of the impedance between the node N4 and the reference potential is 10 times or more of the reference impedance.

[Example of Impedance Conversion Circuit 34]

Figure 14:
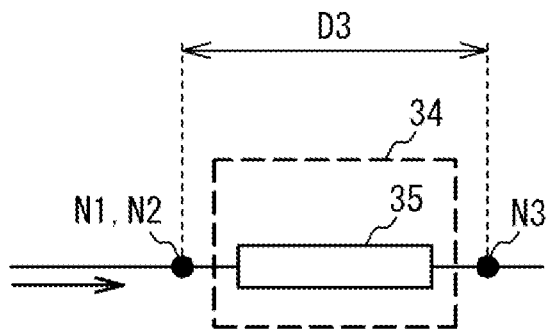
FIG. 14 is a circuit diagram illustrating an example of an impedance conversion circuit according to the first and second embodiments and the variations thereof.
Figure 15:
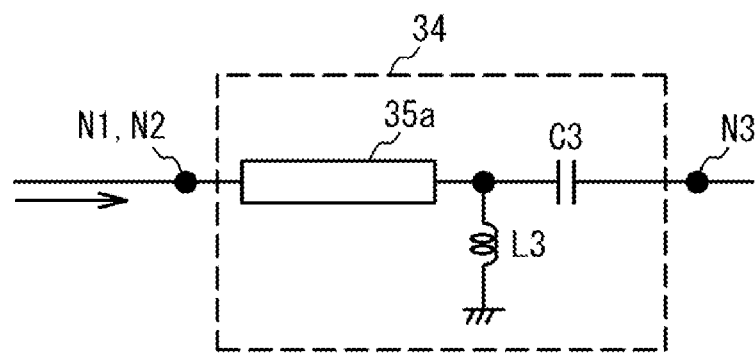
FIG. 15 is a circuit diagram illustrating an example of an impedance conversion circuit according to the first and second embodiments and the variations thereof.
Figure 16:
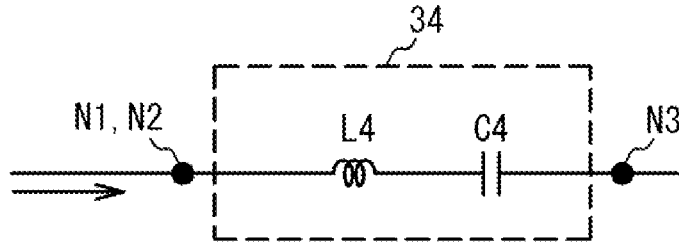
FIG. 16 is a circuit diagram illustrating an example of an impedance conversion circuit according to the first and second embodiments and the variations thereof.

FIGS. 14 to 16 are circuit diagrams illustrating examples of impedance conversion circuits according to the first and the second embodiments and the variations thereof. As illustrated in FIG. 14, the impedance conversion circuit 34 is a transmission line 35 connected between the node N1 or N2 and the node N3. A high frequency signal including the fundamental wave and the second harmonic wave flows through the transmission line 35 from left to right as indicated by an arrow. An electrical length D3 between the nodes N1 or N2 and N3 in the transmission line 35 is ¼ of the wavelength λ, of the fundamental wave. Thereby, the phase of the fundamental wave at the node N3 changes by 90° with respect to the node N1 or N2, and the phase of the second harmonic wave at the node N3 changes by 180° with respect to the node N1 or N2. On the Smith chart of FIG. 2, the impedance at the node N3 in the fundamental wave rotates by 180° around the reference impedance 66 with respect to the impedance at the node N1, and the impedance at the node N3 in the second harmonic wave rotates by 360° around the reference impedance 66 with respect to the impedance at the node N1. An electric length D3 is preferably ³⁄₁₆ or more and ⁵⁄₁₆ or less of the wavelength of the fundamental wave, more preferably ⁷⁄₃₂ or more and ⁹⁄₃₂ or less, and even more preferably ¹⁵⁄₆₄ or more and ¹⁷⁄₆₄ or less. The characteristic impedance of the transmission line 35 in the fundamental wave may be the reference impedance or may be different from the reference impedance.

As illustrated in FIG. 15, the impedance conversion circuit 34 includes a transmission line 35*a* and a capacitor C3 connected in series between the node N1 or N2 and the node N3, and an inductor L3 shunt-connected to the node between the transmission line 35*a* and the capacitor C3. By appropriately designing the electrical length of the transmission line 35*a*, the capacitance of the capacitor C3, and the inductance of the inductor L3, the impedance at the node N3 in the fundamental wave can be rotated by 180° around the reference impedance 66 with respect to the impedance at the node N1, and the impedance at the node N3 in the second harmonic wave can be rotated by 360° around the reference impedance 66 with respect to the impedance at the node N1 on the Smith chart of FIG. 2. As an example, when the frequency of the fundamental wave is 2 GHz, the electrical length of the transmission line 35*a* is made to correspond to the 23° phase of the fundamental wave, and the characteristic impedance of the transmission line 35*a* is made to be 50Ω. The capacitance of the capacitor C3 is 1.2 pF, and the inductance of the inductor L3 is 3.4 nH. By providing the capacitor C3 and the inductor L3, the electrical length of the transmission line 35*a* can be made smaller than λ/4. Thus, the impedance conversion circuit 34 can be reduced in size.

As illustrated in FIG. 16, the impedance conversion circuit 34 includes an inductor L4 and a capacitor C4 connected in series between the node N1 or N2 and the node N3. By appropriately designing the capacitance of the capacitor C4 and the inductance of the inductor L4, the impedance at the node N3 in the fundamental wave can be rotated by 180° around the reference impedance 66 with respect to the impedance at the node N1, and the impedance at the node N3 in the second harmonic wave can be rotated by 360° around the reference impedance 66 with respect to the impedance at the node N1 on the Smith chart of FIG. 2. As an example, when the frequency of the fundamental wave is 2 GHz, the capacitance of the capacitor C4 is set to 0.1 pF and the inductance of the inductor L4 is set to 15.805 nH. In FIG. 16, since the transmission lines 35 and 35*a* are not provided, the impedance conversion circuit 34 can be reduced in size.

As illustrated in FIGS. 14 to 16, the impedance conversion circuit 34 may rotate the impedance at the node N3 by 360° on the Smith chart with respect to the impedance at the node N1 or N2 in the second harmonic wave. The rotation of the impedance in the second harmonic wave need not be exactly 360°. The impedance conversion circuit 34 may rotate the impedance in the second harmonic wave within a range of 360°±45°. Thereby, the impedance of the short-circuit position 60 at the node N1 or N2 is located in a range between the positions 68*a* and 68*b* on the outer circumference in FIG. 2, and is substantially short-circuited at the node N3. The impedance conversion circuit 34 preferably changes the impedance in the second harmonic wave within a range of 360°±22.5°, more preferably within a range of 360°±11.25°.

In the fundamental wave, the impedance conversion circuit 34 may rotate the impedance at the node N3 by 180° on the Smith chart with respect to the impedance at the node N1 or N2. The rotation of the impedance in the fundamental wave need not be strictly 180°. The impedance conversion circuit 34 may rotate the impedance of the fundamental wave within a range of 180°±22.5°. Thus, in the fundamental wave, the impedance conversion circuit 34 converts the impedance substantially on the real axis 64 at the node N1 or N2 into the impedance substantially on the real axis 64 at the node N3. The impedance conversion circuit 34 preferably changes the impedance in the fundamental wave within a range of 180°±11.25°, and more preferably within a range of 180°±5.625°.

[Position of Node N4 in Second Embodiment and Variations Thereof]

Figure 17:
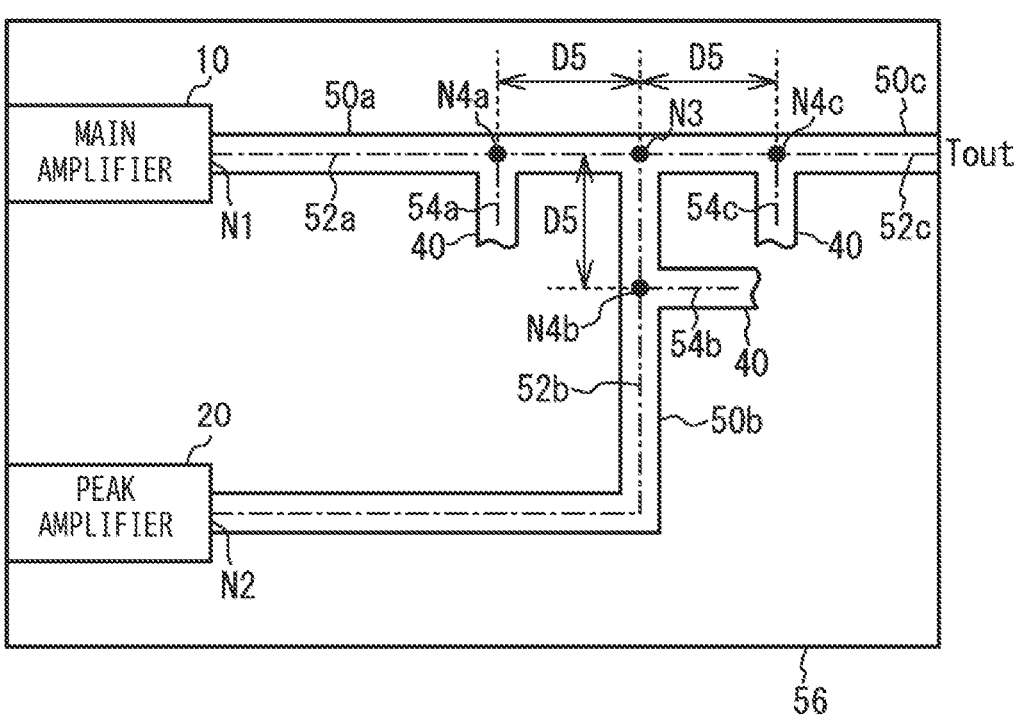
FIG. 17 is a plan view of the vicinity of a node N3 in the second embodiment and the variations thereof.

In the second embodiment and the variations thereof, the position of the node N4 to which the harmonic tuning circuit 40 is connected will be described. FIG. 17 is a plan view of the vicinity of the node N3 in the second embodiment and the variations thereof. In FIG. 17, three harmonic tuning circuits 40 are illustrated, indicating that one harmonic tuning circuit 40 is connected to any one of nodes N4*a* to N4*c*. As illustrated in FIG. 17, there are provided a line 50*a* extending from the main amplifier 10 to the node N3 via the node N1, a line 50*b* extending from the peak amplifier 20 to the node N3 via the node N2, and a line 50*c* extending from the node N3 to the output terminal Tout. The lines 50*a* to 50*c* are metal films provided on a dielectric layer 56, and form a microstrip line along with a ground metal film under the dielectric layer 56. The lines 50*a* to 50*c* may be signal lines of a coplanar line. The node N3 is a place where center lines 52*a* and 52*b* of the lines 50*a* and 50*b* intersect each other.

Preferably, the node N4 to which the first end of the harmonic tuning circuit 40 is connected coincides with the node N3, but the node N4 may not coincide with the node N3. The node N4 may be provided on the line 50*a* like the node N4*a*, on the line 50*b* like the node N4*b*, or on the line 50*c* like the node N4*c*. The nodes N4*a* to N4*c* are positions at which center lines 54*a* to 54*c* of the line in the harmonic tuning circuit 40 intersect with the center lines 52*a* to 52*c*, respectively. When the electrical lengths between the node N3 and the nodes N4*a* to N4*c* become large, the phase difference of the second harmonic waves between the node N1 or N2 and the nodes N4*a* to N4*c* becomes non-negligible, and the second harmonic wave is not reflected at the node N1 or N2. From this viewpoint, the electrical lengths D5 between the node N3 and the nodes N4*a* to N4*c* are preferably ¹⁄₁₆ or less, more preferably ¹⁄₃₂ or less, and even more preferably ¹⁄₆₄ or less of the wavelength of the fundamental wave.

The electric length D5 can be calculated from the physical lengths of the center lines 52a to 52c between a point where the center lines 52a and 52b intersect and points where the center lines 52a to 52c and 54a to 54c intersect, taking into consideration the relative dielectric constant of the dielectric layer 56. The electrical length between the node N1 or N2 and the node N3 in the first embodiment and the variations thereof can be calculated in the same manner.

[Simulation]

An efficiency with respect to an output power was simulated for the Doherty amplifier 102 illustrated in FIG. 4 in the second variation of the first embodiment. For comparison, the efficiency with respect to the output power was simulated for the first and the second comparative examples.

Figure 18:
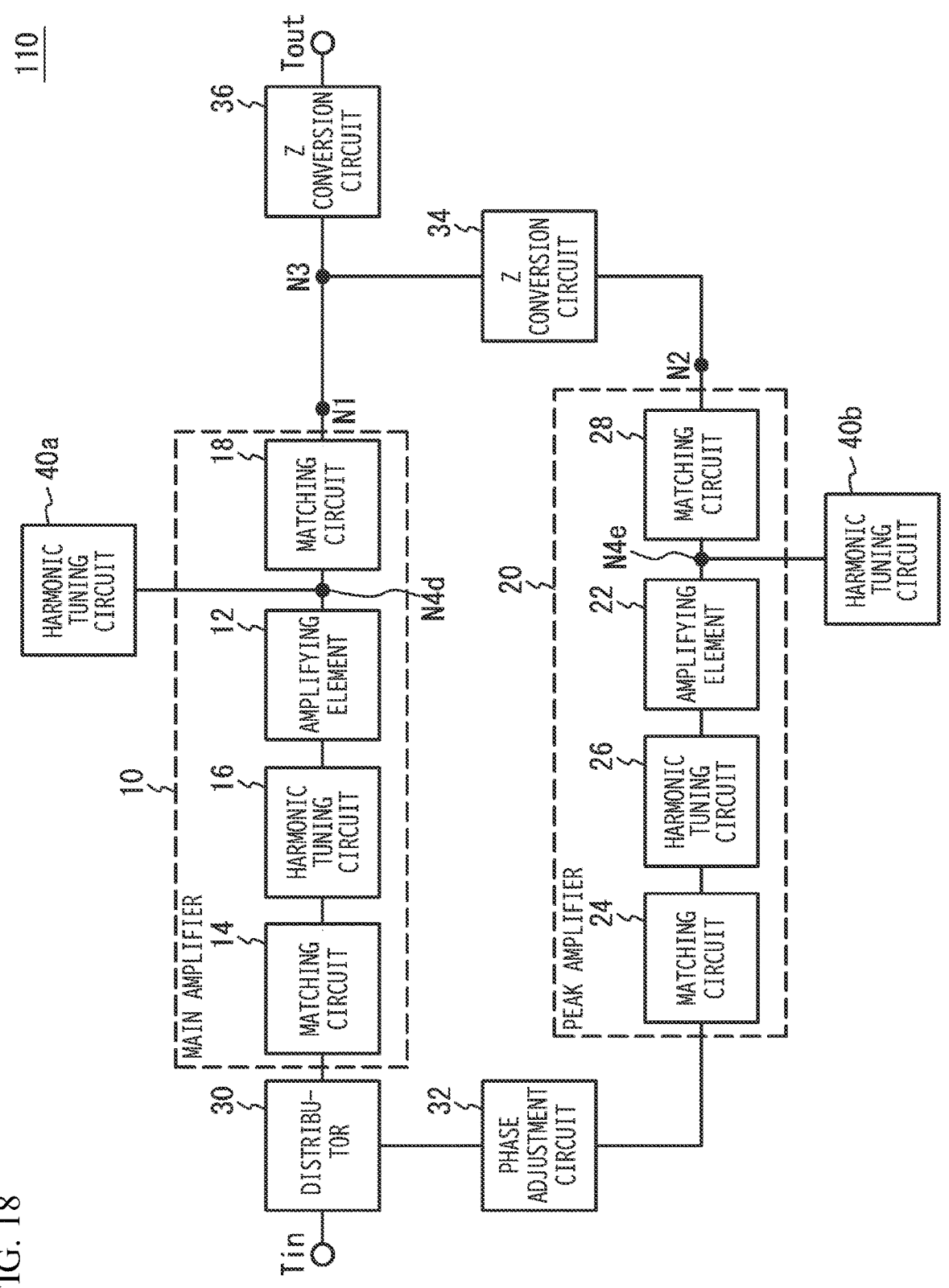
FIG. 18 is a block diagram of a Doherty amplifier according to a second comparative example.

FIG. 18 is a block diagram of the Doherty amplifier according to the second comparative example. As illustrated in FIG. 18, in a Doherty amplifier 110 of the second comparative example, a first end of a harmonic tuning circuit 40a is connected to a node N4d between the amplifying element 12 and the matching circuit 18, and a first end of a harmonic tuning circuit 40b is connected to a node N4e between the amplifying device 22 and the matching circuit 28. Other configurations are the same as those of the Doherty amplifier of the second variation of the first embodiment illustrated in FIG. 4. In the first comparative example, the harmonic tuning circuits 40a and 40b are not provided in FIG. 18. The frequency of the fundamental wave is 3.5 GHz, the impedance conversion circuit 34 is a transmission line having an electrical length of ¼ of the wavelength of the fundamental wave and having a characteristic impedance of 50Ω, and the harmonic tuning circuits 40, 40a, and 40b are short stubs having an electrical length of ¼ of the wavelength of the fundamental wave.

Figure 19:
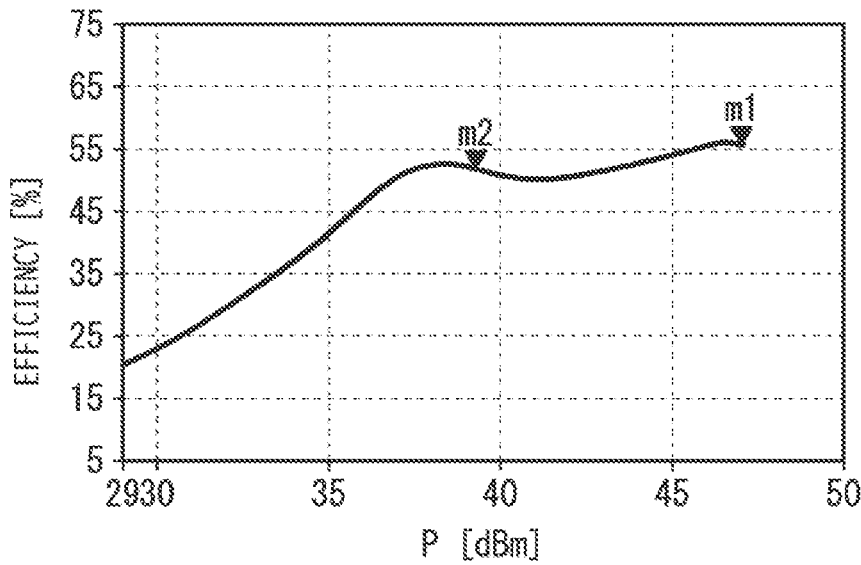
FIG. 19 is a diagram illustrating an efficiency with respect to an output power P in a first comparative example.
Figure 20:
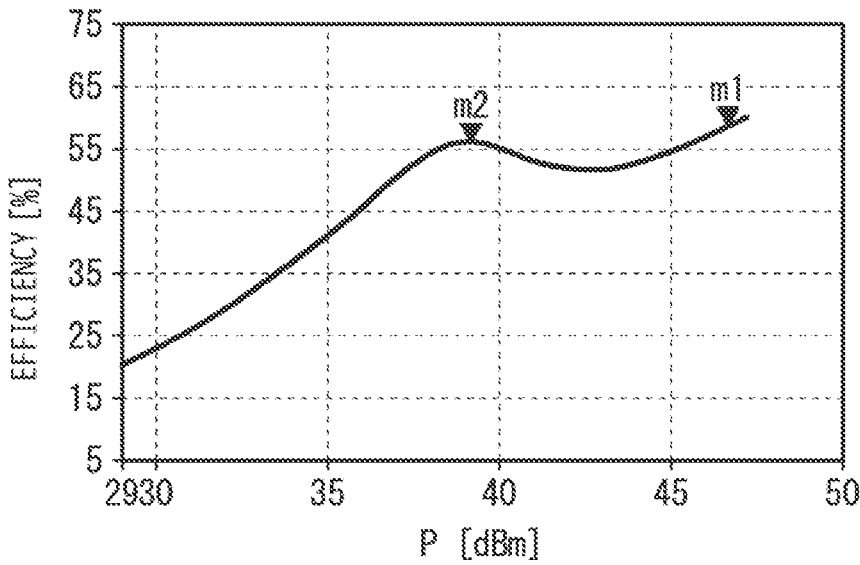
FIG. 20 is a diagram illustrating an efficiency with respect to an output power P in a second comparative example.
Figure 21:
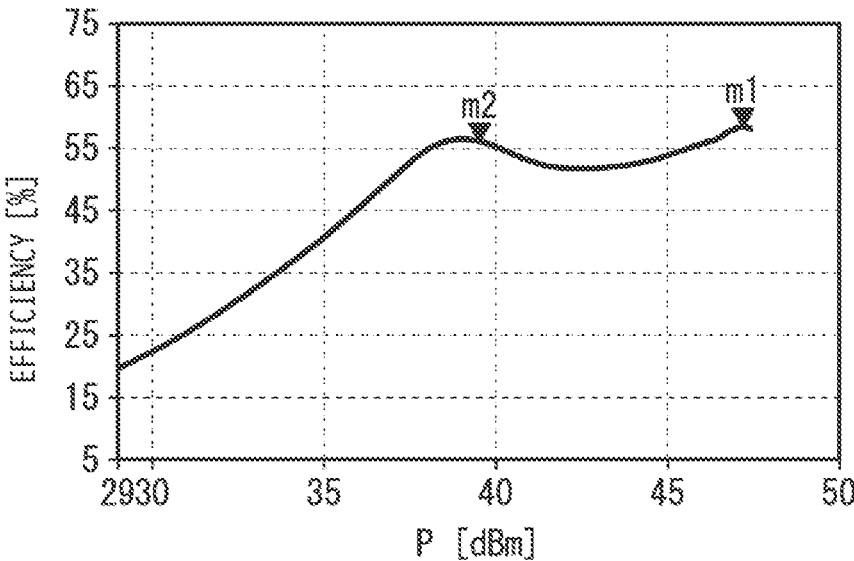
FIG. 21 is a diagram illustrating an efficiency with respect to an output power P in a second variation of the first embodiment.

FIG. 19 is a diagram illustrating an efficiency with respect to an output power P in the first comparative example. FIG. 20 is a diagram illustrating an efficiency with respect to an output power P in a second comparative example. FIG. 21 is a diagram illustrating an efficiency with respect to an output power P in a second variation of the first embodiment. In FIGS. 19 to 21, the efficiency is a drain efficiency. A marker m1 indicates a position of the saturated output power Psat, and a marker m2 is a position back-off from the saturated output power Psat by about 7 dBm.

As illustrated in FIG. 19, in the first comparative example, the efficiencies of the markers m1 and m2 are 56.1% and 51.9%, respectively. As illustrated in FIG. 20, in the second comparative example, the efficiencies of the markers m1 and m2 are 58.8% and 56.1%, respectively. As in the second comparative example, by providing the harmonic tuning circuits 40a and 40b in the main amplifier 10 and the peak amplifier 20, respectively, the output of the second harmonic wave to the output terminal Tout can be suppressed, and the efficiency can be improved. As illustrated in FIG. 21, in the second variation of the first embodiment, the efficiencies of the markers m1 and m2 are 58.1% and 55.8%, respectively. As in the second variation of the first embodiment, even if only one harmonic tuning circuit 40 is provided and the Doherty amplifier is reduced in size, the efficiencies can be approximately the same as the efficiencies of the second comparative example.

When the same simulation was performed in the Doherty amplifier 107 in FIG. 9 of the third variation of the second embodiment, the same result as that of the first variation of the first embodiment was obtained.

As in Patent Document 1, if the position of the node N4 to which the harmonic tuning circuit is connected is not appropriately set even if only one harmonic tuning circuit is provided, both of the second harmonic wave output from the main amplifier 10 and the second harmonic wave output from the peak amplifier 20 cannot be appropriately processed. Therefore, if only one harmonic tuning circuit is provided and the Doherty amplifier is reduced in size, the harmonic characteristics are deteriorated and the efficiencies are reduced.

The first embodiment and the first variation thereof indicate the forward Doherty amplifiers. As illustrated in FIGS. 1 and 3, a first amplifier that outputs the amplified signal to a first node N1 is the main amplifier 10, and a second amplifier that outputs the amplified signal of a second node N2 is the peak amplifier 20. The impedance conversion circuit 34 has a first end connected to the first node N1 and a second end connected to the node N3. The first end of the harmonic tuning circuit 40 is connected to the line connecting the main amplifier 10 and a third node N3 at the first node N1.

The second and the third variations of the first embodiment indicate the inverse Doherty amplifiers. As illustrated in FIGS. 4 and 5, the first amplifier that outputs the amplified signal to the first node N2 is the peak amplifier 20, and the second amplifier that outputs the amplified signal of the second node N1 is the main amplifier 10. The impedance conversion circuit 34 has the first end connected to the first node N2 and the second end connected to the node N3. The first end of the harmonic tuning circuit 40 is connected to the line connecting the peak amplifier 20 and the third node N3 at the first node N2.

In such a forward Doherty amplifier and an inverse Doherty amplifier, the impedance conversion circuit 34 rotates the impedance viewed from the first amplifier to the node N3 with respect to the impedance viewed from the first amplifier to the first node N1 or N2 within a range of 360°±45° on the Smith chart in the second harmonic wave. The harmonic tuning circuit 40 makes the absolute value of the impedance with respect to the reference potential at the node N4 in the second harmonic wave smaller than the absolute value of the impedance with respect to the reference potential at the node N4 in the fundamental wave. Thus, the second harmonic wave output from the first amplifier is mostly reflected at the first node N1 or N2, and the second harmonic wave output from the second amplifier is mostly reflected at the third node N3. Therefore, both of the second harmonic wave output from the first amplifier and the second harmonic wave output from the second amplifier can be processed by the impedance conversion circuit 34 and the harmonic tuning circuit 40, and the characteristics of the Doherty amplifier can be improved.

The second embodiment and the first variation thereof indicate the forward Doherty amplifiers. As illustrated in FIGS. 6 and 7, the first amplifier which outputs the amplified signal to the first node N1 is the main amplifier 10, and the second amplifier which outputs the amplified signal of the second node N2 is the peak amplifier 20. The impedance conversion circuit 34 has the first end connected to the first node N1 and the second end connected to the third node N3. The first end of the harmonic tuning circuit 40 is connected to a fourth node N4 positioned on any of the third node N3, a first line connecting the main amplifier 10 and the third node N3, a second line connecting the peak amplifier 20 and the third node N3, and a third line connecting the third node N3 and the output terminal Tout. The electrical length between the third node N3 and the fourth node N4 is ¹⁄₁₆ or less of the wavelength of the fundamental wave.

The second and the third variations of the second embodiment indicate the inverse Doherty amplifiers. As illustrated in FIGS. 8 and 9, the first amplifier that outputs the amplified signal to the first node N2 is the peak amplifier 20, and the second amplifier that outputs the amplified signal of the second node N1 is the main amplifier 10. The impedance conversion circuit 34 has the first end connected to the first node N2 and the second end connected to the third node N3. The first end of the harmonic tuning circuit 40 is connected to the fourth node N4 positioned on any of the third node N3, the first line connecting the peak amplifier 20 and the third node N3, the second line connecting the main amplifier 10 and the third node N3, and the third line connecting the third node N3 and the output terminal Tout. The electrical length between the third node N3 and the fourth node N4 is ¹⁄₁₆ or less of the wavelength of the fundamental wave.

In such a forward Doherty amplifier and an inverse Doherty amplifier, the impedance conversion circuit 34 rotates the impedance viewed from the first amplifier to the node N3 with respect to the impedance viewed from the first amplifier to the first node N1 or N2 within a range of 360°±45° on the Smith chart in the second harmonic wave. The harmonic tuning circuit 40 makes the absolute value of the impedance with respect to the reference potential at the node N4 in the second harmonic wave smaller than the absolute value of the impedance with respect to the reference potential at the node N4 in the fundamental wave. Thus, the second harmonic wave output from the first amplifier is mostly reflected at the first node N1 or N2, and the second harmonic wave output from the second amplifier is mostly reflected at the fourth node N4. Therefore, both of the second harmonic wave output from the first amplifier and the second harmonic wave output from the second amplifier can be processed by the impedance conversion circuit 34 and the harmonic tuning circuit 40, and the characteristics of the Doherty amplifier can be improved.

As illustrated in FIGS. 1 and 3 to 9, there is not provided a harmonic tuning circuit in which the first end is connected to the line connecting the second amplifier and the third node, and which makes the absolute value of the impedance with respect to the reference potential at the first end in the second harmonic wave smaller than the absolute value of the impedance with respect to the reference potential at the first end in the fundamental wave. Thus, since only one harmonic tuning circuit 40 is provided, the Doherty amplifier can be reduced in size.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A Doherty amplifier comprising:
a distributor that distributes an input signal inputted to an input terminal into two signals;
a first amplifier that amplifies one of the two signals and outputs a first amplified signal to a first node;
a second amplifier that amplifies the other of the two signals and outputs a second amplified signal to a second node;
a third node that combines the first amplified signal output from the first amplifier and the second amplified signal output from the second amplifier and outputs a combined signal to an output terminal;

an impedance conversion circuit that has a first end connected to the first node and a second end connected to the third node, and rotates an impedance viewed from the first amplifier to the third node with respect to an impedance viewed from the first amplifier to the first node within a range of 360±450 on a Smith chart in a second harmonic wave, the second harmonic wave having a twice as high as a frequency of a fundamental wave that is a signal having a center frequency of an operation band; and
a harmonic tuning circuit that has a third end connected to a line connecting the first amplifier and the third node at the first node, and makes an absolute value of an impedance with respect to a reference potential at the third end in the second harmonic wave smaller than an absolute value of an impedance with respect to the reference potential at the third end in the fundamental wave,
wherein the impedance conversion circuit rotates an impedance viewed from the first amplifier to the third node with respect to an impedance viewed from the first amplifier to the first node within a range of 180±22.5 0 on a Smith chart in the fundamental wave.

2. A Doherty amplifier comprising:
a distributor that distributes an input signal inputted to an input terminal into two signals;
a first amplifier that amplifies one of the two signals and outputs a first amplified signal to a first node;
a second amplifier that amplifies the other of the two signals and outputs a second amplified signal to a second node;
a third node that combines the first amplified signal output from the first amplifier and the second amplified signal output from the second amplifier and outputs a combined signal to an output terminal;
an impedance conversion circuit that has a first end connected to the first node and a second end connected to the third node, and rotates an impedance viewed from the first amplifier to the third node with respect to an impedance viewed from the first amplifier to the first node within a range of 360±450 on a Smith chart in a second harmonic wave, the second harmonic wave having a twice as high as a frequency of a fundamental wave that is a signal having a center frequency of an operation band; and
a harmonic tuning circuit that has a third end connected to a fourth node positioned on any one of the third node, a first line connecting the first amplifier and the third node, a second line connecting the second amplifier and the third node, and a third line connecting the third node and the output terminal, and makes an absolute value of an impedance with respect to a reference potential at the third end in the second harmonic wave smaller than an absolute value of an impedance with respect to the reference potential at the third end in the fundamental wave;
wherein an electrical length between the third node and the fourth node is ¹⁄₁₆ or less of the wavelength of the fundamental wave,
wherein the impedance conversion circuit rotates an impedance viewed from the first amplifier to the third node with respect to an impedance viewed from the first amplifier to the first node within a range of 180±22.5 0 on a Smith chart in the fundamental wave.

3. The Doherty amplifier according to claim 1, wherein the harmonic tuning circuit short-circuits between the third end and the reference potential in the second harmonic wave and does not short-circuit between the third end and the reference potential in the fundamental wave.

4. The Doherty amplifier according to claim 1, wherein the harmonic tuning circuit opens between the third end and the reference potential in the fundamental wave.

5. The Doherty amplifier according to claim 1, wherein the harmonic tuning circuit is a stub having an electric length of $\frac{3}{16}$ or more and $\frac{5}{16}$ or less of the wavelength of the fundamental wave, and a fourth end connected to the reference potential.

6. The Doherty amplifier circuit according to claim 1, wherein the harmonic tuning circuit is a stub having an electrical length of $\frac{1}{16}$ or more and $\frac{3}{16}$ or less of the wavelength of the fundamental wave, and a fourth end being opened.

7. The Doherty amplifier circuit according to claim 1, wherein the first amplifier is a main amplifier and the second amplifier is a peak amplifier.

8. The Doherty amplifier circuit according to claim 1, wherein the impedance conversion circuit is a transmission line having an electric length of $\frac{3}{16}$ or more and $\frac{5}{16}$ or less of the fundamental wave.

9. The Doherty amplifier circuit according to claim 1, wherein the first amplifier is a peak amplifier and the second amplifier is a main amplifier.

* * * * *